(12) United States Patent
Isik et al.

(10) Patent No.: US 8,395,247 B1
(45) Date of Patent: Mar. 12, 2013

(54) METHOD AND APPARATUS FOR PLACING QUARTZ SAW DEVICES TOGETHER WITH CLOCK/OSCILLATOR

(75) Inventors: Tacettin Isik, Saratoga, CA (US); Robert Paul Bernardo, Marco Island, FL (US)

(73) Assignee: Integrated Device Technology, Inc., San Jose, CA (US)

( * ) Notice: Subject to any disclaimer, the term of this patent is extended or adjusted under 35 U.S.C. 154(b) by 205 days.

(21) Appl. No.: 12/493,510

(22) Filed: Jun. 29, 2009

(51) Int. Cl.
*H01L 23/495* (2006.01)
*H01L 23/34* (2006.01)

(52) U.S. Cl. .. 257/676; 257/723; 257/724; 374/E11.012

(58) Field of Classification Search .................. 257/723, 257/724, 666, 676, E23.01; 29/25.35; 333/193; 374/E11.012; 375/151, 153, E1.017
See application file for complete search history.

(56) References Cited

U.S. PATENT DOCUMENTS

| | | | | |
|---|---|---|---|---|
| 5,303,457 | A * | 4/1994 | Falkner et al. | 29/25.35 |
| 5,867,074 | A * | 2/1999 | Ogiso et al. | 333/193 |
| 5,918,112 | A * | 6/1999 | Shah et al. | 438/107 |
| 6,683,370 | B1 * | 1/2004 | McDonald et al. | 257/676 |
| 7,282,786 | B2 * | 10/2007 | Jung et al. | 257/666 |
| 2002/0140079 | A1 * | 10/2002 | Takeyama | 257/698 |
| 2007/0096160 | A1 * | 5/2007 | Beroz et al. | 257/232 |
| 2007/0152538 | A1 * | 7/2007 | Huang et al. | 310/313 B |
| 2008/0055878 | A1 * | 3/2008 | Salzman | 361/818 |

FOREIGN PATENT DOCUMENTS

JP    01312856 A   * 12/1989
JP    01320809 A   * 12/1989

* cited by examiner

*Primary Examiner* — Teresa M Arroyo
(74) *Attorney, Agent, or Firm* — Heimlich Law, PC; Alan Heimlich, Esq.

(57) ABSTRACT

A method and apparatus for placing quartz SAW (Surface Acoustic Wave) devices together with a clock/oscillator have been disclosed. Mounting on a single lead frame both a SAW device and an integrated circuit (IC).

4 Claims, 10 Drawing Sheets

METHOD AND APPARATUS FOR PLACING QUARTZ SAW DEVICES TOGETHER WITH CLOCK/OSCILLATOR

FIELD OF THE INVENTION

The present invention pertains to clocks and oscillators. More particularly, the present invention relates to a method and apparatus for placing quartz SAW (Surface Acoustic Wave) devices together with a clock/oscillator.

BACKGROUND OF THE INVENTION

It is desirable to reduce the number of quartz crystals (XTAL) in an electronic system from various standpoints, such as, but not limited to, power consumption, reliability, space considerations, costs, etc. XTALs are used to generate electrical signals with accurate frequencies. As electronic systems get more complicated, demand for various and higher frequencies has increased. To satisfy this demand, phase locked loop (PLL) technology has been widely used. What PLL offers is to use a number of XTALs and generate almost any frequency out of reference signals based on the stable XTAL oscillators. Quartz XTAL oscillators however, have certain weakness. It has been very difficult and expensive to make very low phase noise oscillators at high frequencies above 100 MHz. This presents a problem.

BRIEF DESCRIPTION OF THE DRAWINGS

The invention is illustrated by way of example and not limitation in the figures of the accompanying drawings in which.

SUMMARY OF THE INVENTION

Figure 1:
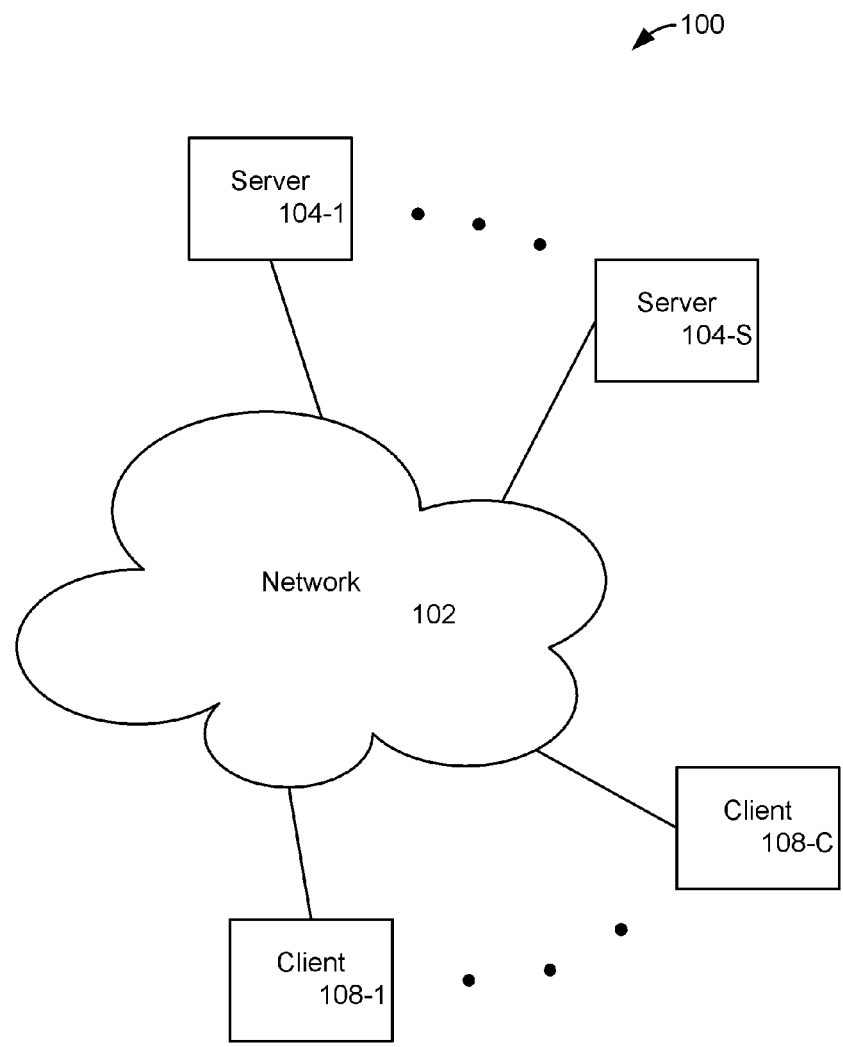
FIG. 1 illustrates a network environment in which the method and apparatus of the invention may be implemented.

A method and apparatus for placing quartz SAW devices together with clock/oscillator is disclosed. In one approach a special lead frame (also spelled leadframe) with a silicon carrier paddle is on one side. On the other side, a quartz SAW die carrier paddle is built by using two symmetrical extensions of leads that are connected to silicon. These two extensions are placed sufficiently apart to insure insulation, but close enough to carry the quartz die. The two extensions are widened to constitute the paddle for the quartz die and extended towards the sides to make sufficient space for wire bonding to the SAW device which is processed on the quartz's surface. The assembly is then hermetically sealed. These and other embodiments of the present invention are described in the writings and drawings herewith.

DETAILED DESCRIPTION

In one embodiment of the invention, surface acoustic wave (SAW) devices provide high frequency and low phase noise needed for clock distribution in electronic circuits. When the SAW device is built on quartz material it can offer similar temperature stability and similar nominal frequency accuracy as quartz resonators with smaller device sizes in high frequencies. Packaging of SAW devices together with silicon active circuits results in an affordable process.

In one embodiment of the invention, a plastic molding around a metal lead frame that carries the devices is used. Quartz is an insulator. SAW devices, as their name imply, operates only on the surface of the quartz material. It is possible to embed a hermetically sealed miniature steel barrel into a plastic molding compound.

In one embodiment a one port SAW device can reduce the effort of the assembly process.

In embodiments of the invention, a special lead frame with a silicon carrier paddle on one side is used. On the other side, a quartz SAW die carrier paddle is built by using two symmetrical extensions of leads that are eventually electrically connected to silicon. These two extensions are placed sufficiently apart to insure insulation, but close enough to carry quartz die. They are widened to constitute the paddle for quartz die and extended towards sides to make sufficient space for wire bonding to the SAW device which is processed on the quartz's surface. Since quartz is naturally an insulator, when it is placed and attached on top of both these extensions, it will not be affected and it will not affect the signal through these extensions. Once the quartz is attached and two wire bondings are done, then in one embodiment, an oval cross-sectioned steel barrel is slid-in to cover this assembly. In one embodiment, in order to hold the barrel in place and also to make a hermetic seal two pieces of specially sculptured glass lids are attached together using techniques illustrated in the Figures. Instead of glass, it is also possible, in one embodiment, to use plastic lids. Once the hermetically sealed barrel is done, the rest of the assembly process, which is to attach the silicon die, wire bond it to the lead frame and to mold the plastic compound, can be done. Since both the SAW resonator and the silicon, which may carry not only an oscillator but, for example, also PLLs and any kind of analog or digital circuitry, are in very close proximity, it is also possible to improve temperature stability of the SAW by additional circuitry on the silicon. In one embodiment, with such a technology, manufacturing very inexpensive temperature compensated surface acoustic wave oscillators (TCSAWO) is possible as well.

Figure 3:
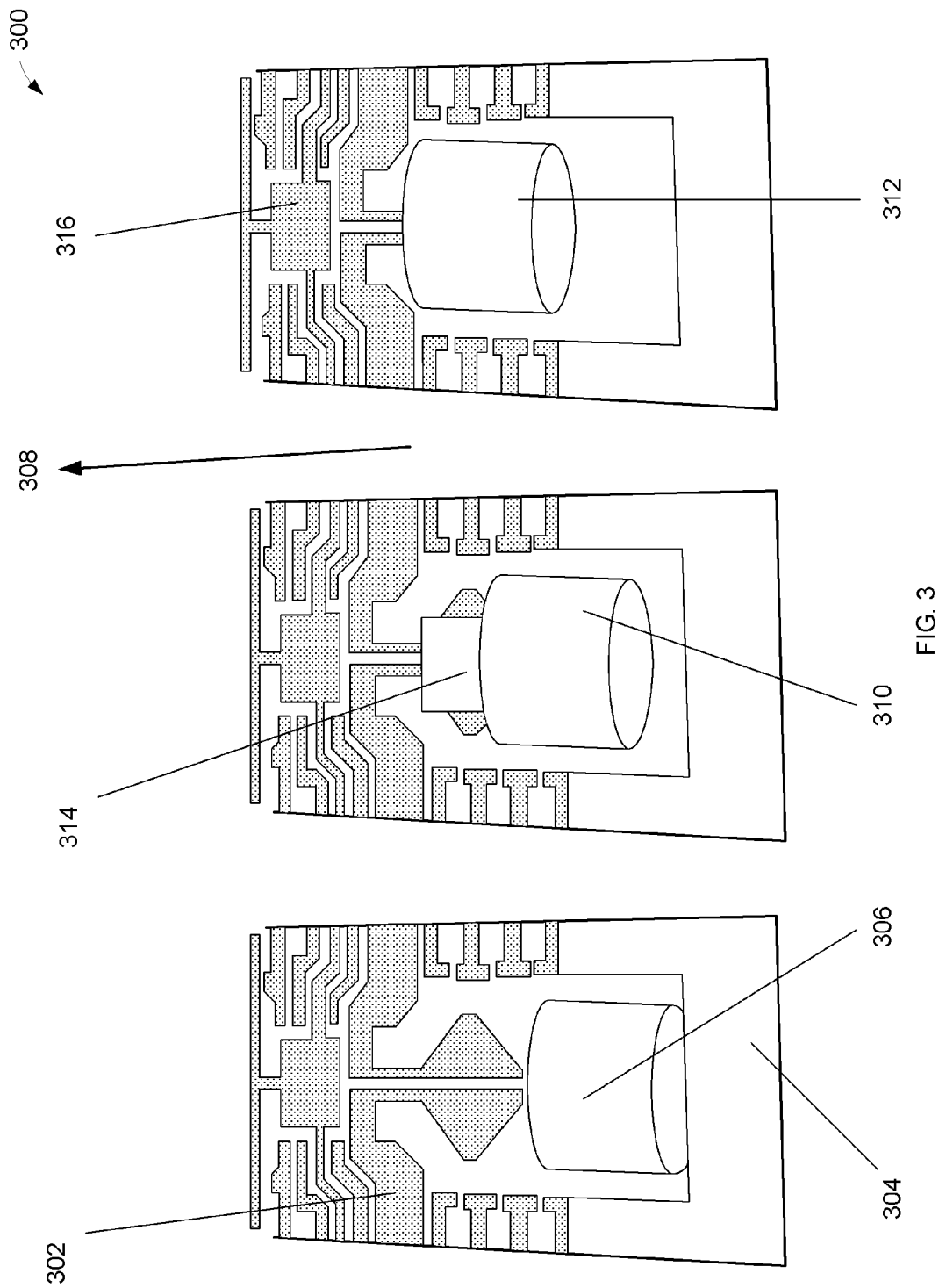
FIG. 3 illustrates one embodiment of the invention showing a specialized lead frame.

FIG. 3 illustrates, generally at 300, one embodiment of the invention. At 302 is shown a specialized lead frame. At 304 is a white shaded portion of the lead frame 302 showing an extension. The extension 304 allows a canister (e.g. a barrel, housing, etc.) 306 to be inserted into the plane of the lead frame 302 during assembly such that it can be moved in the direction indicated by the arrow 308 (e.g. slide in) such that it can go from not covering at 310, to covering at 312, a SAW device at 314 mounted on lead frame 302. Also shown on lead frame 302 is an area 316 where a die, such as silicon (e.g. a clock, oscillator, PLLs, etc), may be mounted. As shown in FIG. 3, the SAW device 314 is protected by the canister 306 and can connect via the lead frame to a die mounted at 316 via for example, bond wires (not shown in FIG. 3). In one embodiment the entire lead frame is then protected with, for example, a plastic molding, or mounted in a package, for example, a ceramic package.

Figure 4:
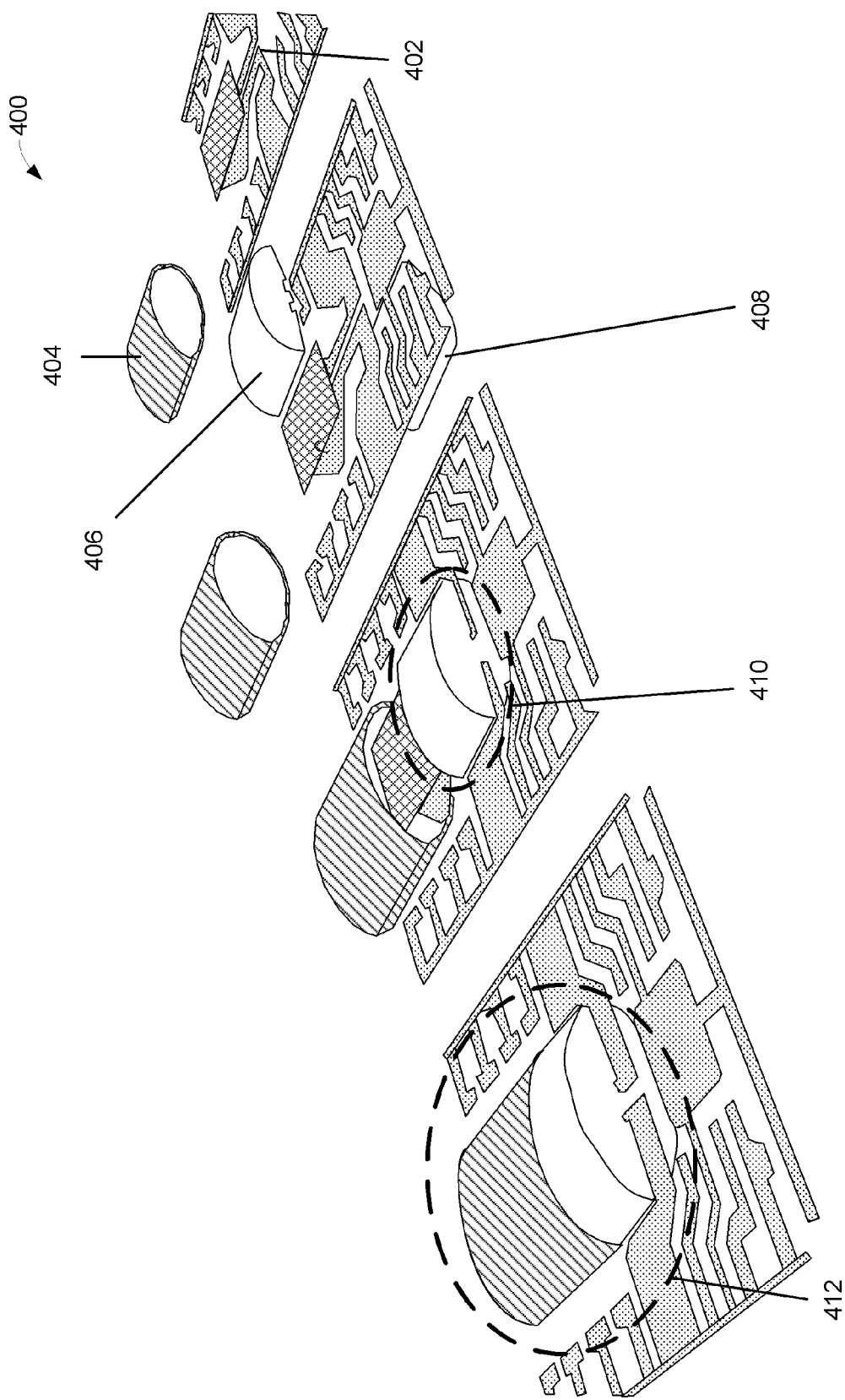
FIG. 4 illustrate one embodiment of the invention showing a perspective.

FIG. 4 illustrates, generally at 400, one embodiment of the invention. The perspective view of FIG. 4 illustrates double half cylinder glass heads placed from the top and the bottom, then fused, with the canister tightly secured on them. Assembly progresses in stages from the right side of FIG. 4 to the left side of FIG. 4. At 402 is shown a specialized lead frame. At 404 is a canister. At 406 a top half cylinder-like glass head and at 408 a bottom half cylinder-like glass head are positioned with respect to the lead frame 402. At 410 may be seen the glass heads positioned against the lead frame. At 412 is the canister 404 partially slide over the glass heads. In one embodiment a force fit of the canister against the glass heads provides a sealing action, for example, the glass heads may have a slight taper onto which the canister is slid. In one embodiment the top and bottom glass heads are fused. In one embodiment both the canister and the glass heads may have a taper. In one embodiment one or more sealing ridges may be on the glass heads and/or the canister and/or lead frame. In one embodiment, the glass heads and canister may be sealed with a compound, such as, but not limited to epoxy. In another embodiment, the canister and glass heads may be sealed by heating them to form a hermetic seal.

Figure 5:
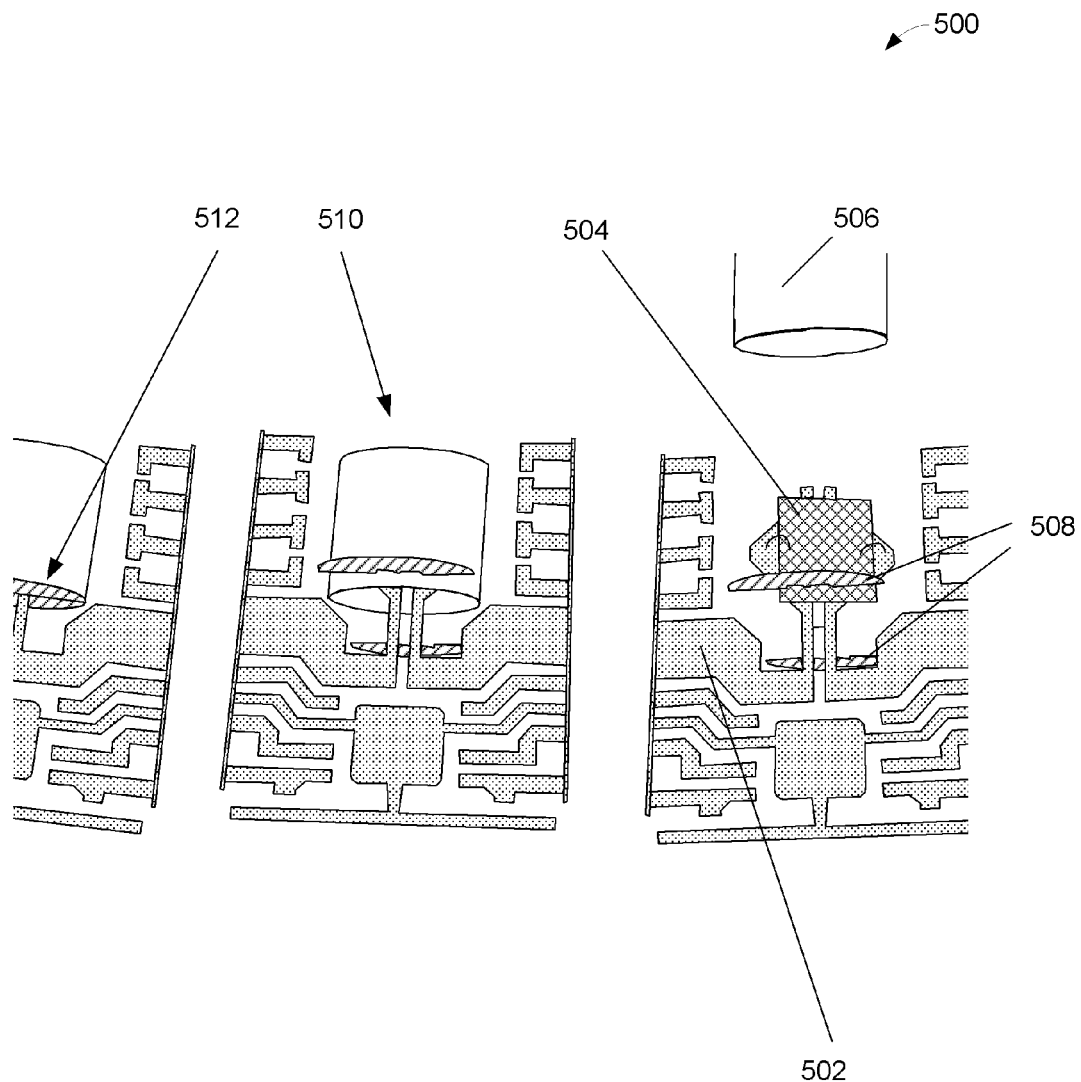
FIG. 5 and FIG. 6 illustrate embodiments of the invention showing phases of mounting processes.

FIG. 5 illustrates, generally at 500, one embodiment of the invention showing from right to left, three phases of the mounting process. At 502 is a lead frame, at 504 a SAW device, at 506 a canister, and at 508 glass lids. At 510 the canister 506 is positioned over the SAW 504. At 512 the glass lids 508 are fused together with the canister 506.

Figure 6:
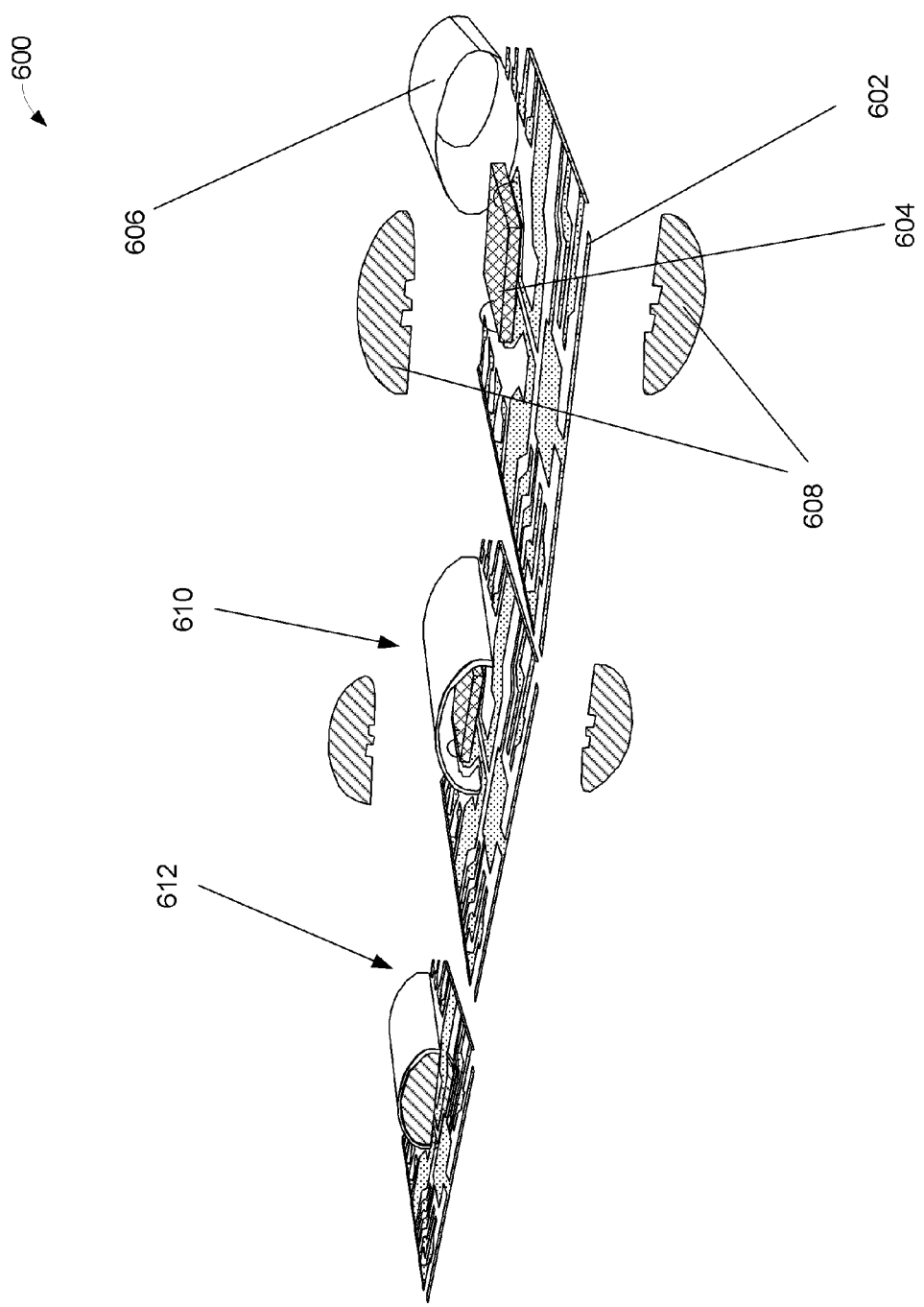

FIG. 6 illustrates, generally at 600, one embodiment of the invention showing from right to left, three phases of the mounting process, such as for example that of FIG. 5. At 602 is a lead frame, at 604 a SAW device mounted on the lead frame 602, at 606 a canister, and at 608 glass lids. At 610 the canister 606 is positioned over the SAW 604. At 612 the glass lids 608 are fused together with the canister 606.

Figure 7:
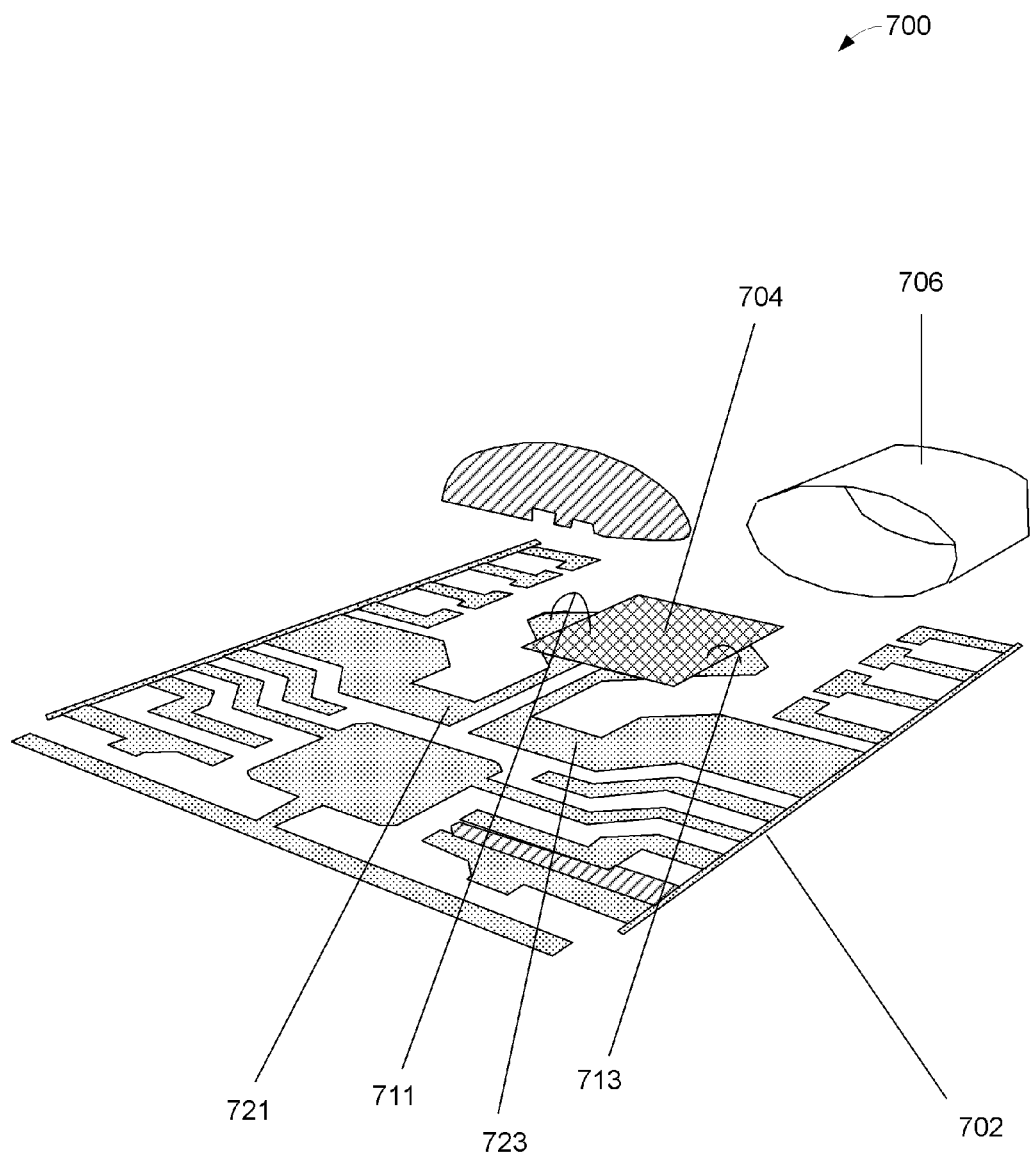
FIG. 7 and FIG. 8 illustrate embodiments of the invention showing close up views.

FIG. 7 illustrates, generally at 700, one embodiment of the invention showing a close up view prior to sealing. At 702 is a lead frame. A quartz SAW device 704 is mounted on the lead frame 702, the bond wires 711 and 713 electrically connect from the SAW device 704 to parts of the lead frame denoted 721 and 723 respectively. At 706 is a canister (e.g. a steel barrel).

Figure 8:
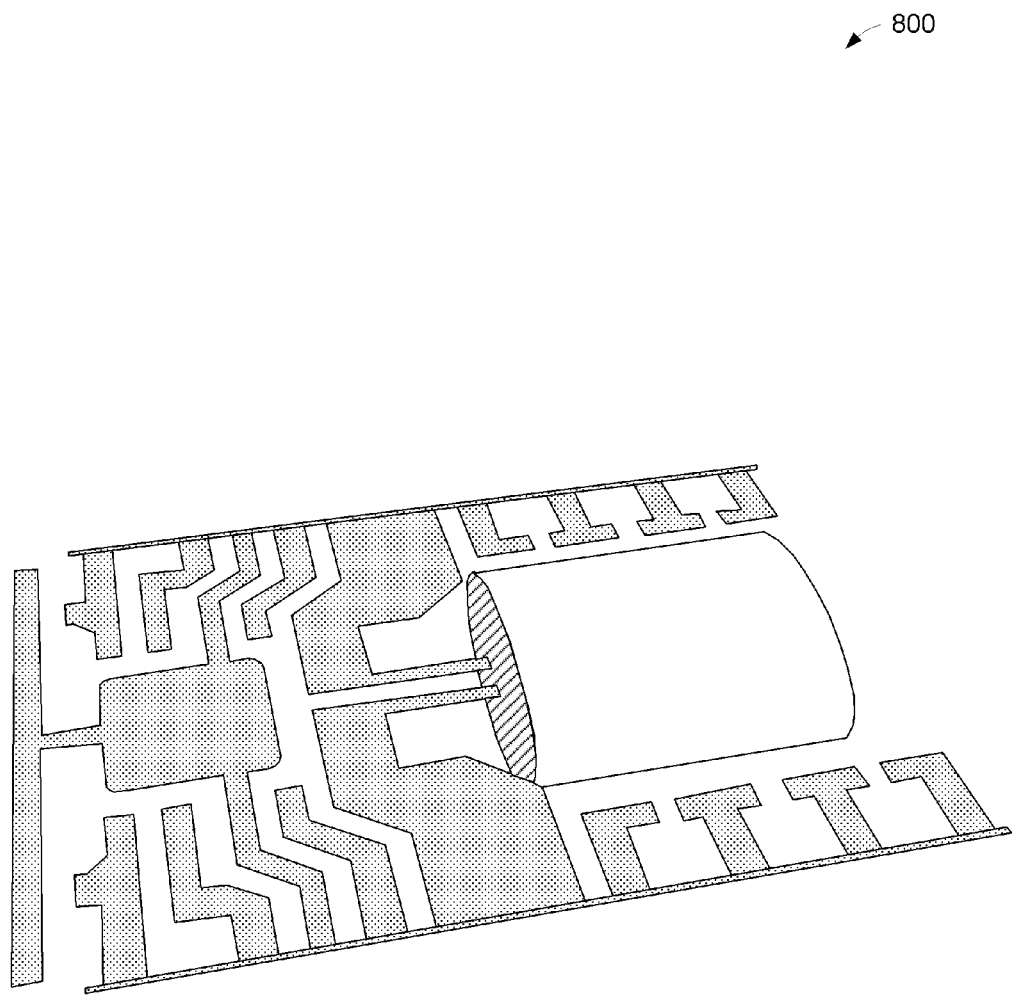

FIG. 8 illustrates, generally at 800, one embodiment of the invention showing a view with glass lids that are hermetically sealed with a barrel to a lead frame. The lead frame is ready to attach silicon (e.g. an IC); then bond the wires between the lead frame and the silicon; and then encapsulate (e.g. mold) the barrel and the IC and portions of the lead frame with plastic (e.g. an electrical insulating material).

Figure 9:
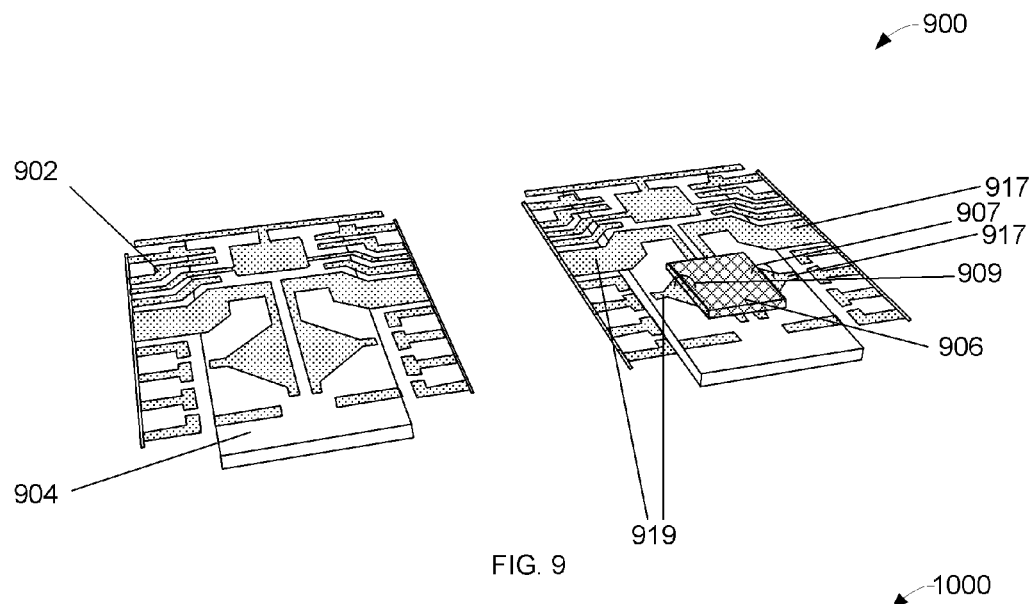
FIG. 9, FIG. 10, and FIG. 11 illustrate embodiments of the invention showing various assembly techniques.

FIG. 9 illustrates, generally at 900, one embodiment of the invention showing on the left a metal lead frame 902 over a plastic frame 904. On the right a SAW 906 is attached to the metal lead frame 902 and wire bonds 907 and 909 go from the SAW 906 to two legs 917 and 919 respectively of the lead frame 902.

Figure 10:
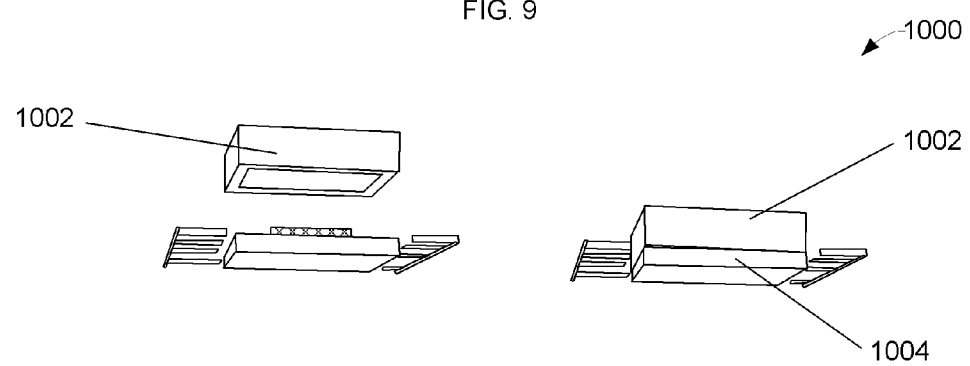

FIG. 10 illustrates, generally at 1000, one embodiment of the invention showing on the left a plastic cap 1002 being positioned, and on the right the plastic cap 1002 secured (e.g. glued) to a bottom plastic piece 1004 (e.g. 904 in FIG. 9).

Figure 11:
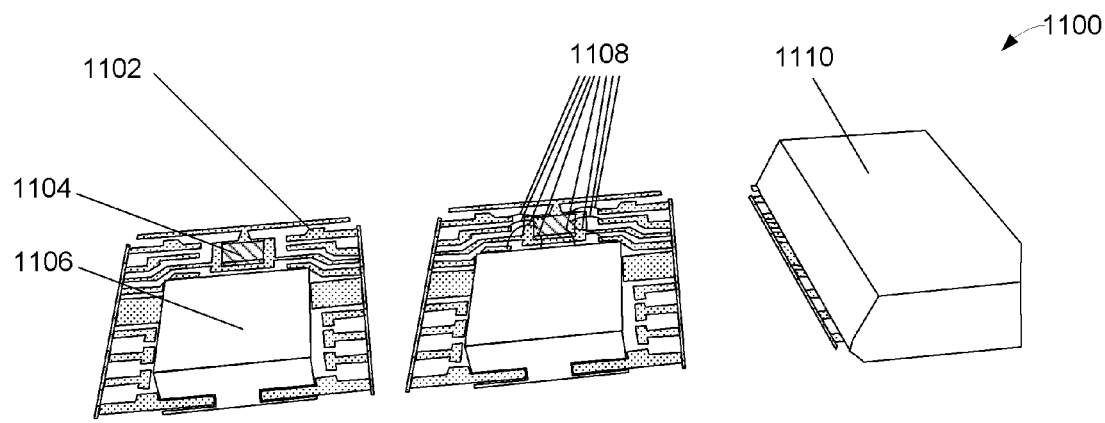

FIG. 11 illustrates, generally at 1100, one embodiment of the invention showing on the left an IC die 1104 attached to the lead frame 1102. At 1106 is a plastic enclosure covering a SAW device (not shown). In the middle, wires are bonded (wire bonds) 1108 between the IC die 1104 and fingers on the lead frame 1102. On the right shows a molded package 1110 enclosing the IC die (not shown on the right) and the plastic enclosure (not shown on the right which is covering a SAW device (also not shown)).

Figure 12:
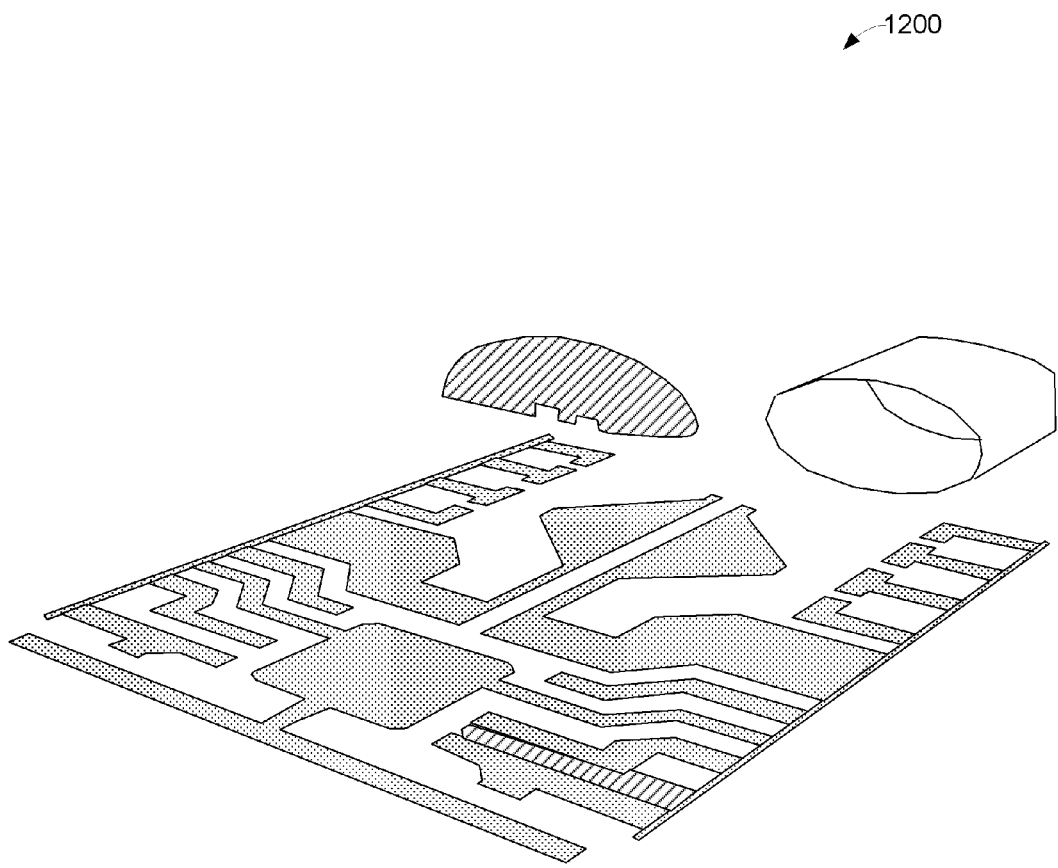
FIG. 12 illustrates an embodiment of the invention as seen in FIG. 7 without the die and wirebonds.

FIG. 12 illustrates, generally at 1200, an embodiment of the invention as seen in FIG. 7 without the die and wirebonds. As can be seen the area on which the die 704 in FIG. 7 rests has two sections substantially triangular in shape.

While various embodiments of the invention have been illustrated, what is to be appreciated is that enclosing a SAW device on the same lead frame as an IC provides a very cost effective device capable of high performance. The mounting and enclosure approaches described allow unfettered operation of the SAW device and efficient coupling to an IC and the use of low cost packaging.

While the invention has been described with respect to a quartz SAW device, the invention is not so limited and one of skill in the art understands that SAW devices may be fabricated on a variety of substrate material, for example, but not limited to lithium niobate, lithium tantalate, lanthanum gallium silicate, etc.

While the invention has been described with respect to wire bonding, the invention is not so limited and one of skill in the art understands other approaches may be used, for example, but not limited to, flip chip devices if properly constructed may be used for the IC and/or SAW devices.

Thus a method and apparatus for placing quartz SAW (Surface Acoustic Wave) devices together with a clock/oscillator have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
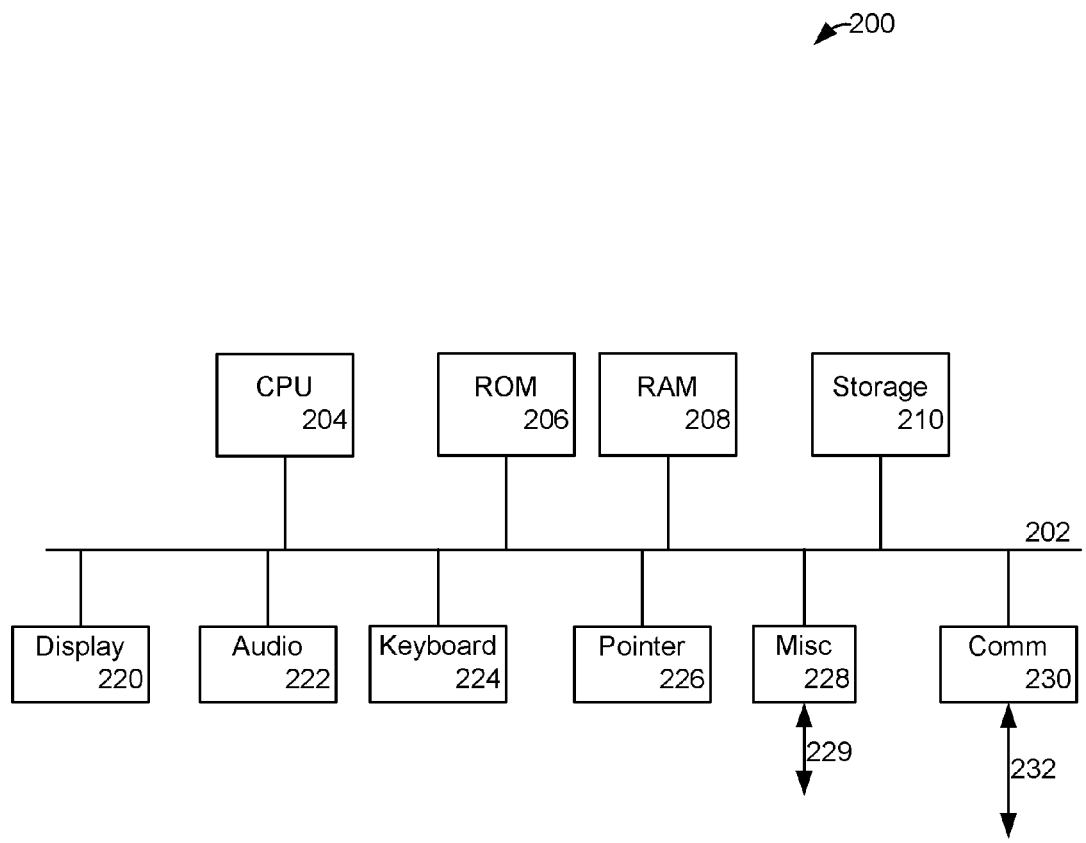
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any electronic device whether local or remote. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Various spellings may be used for terms used in the description. These variations are to be understood to relate to the same term unless denoted otherwise. For example: fail-safe is also spelled fail safe, and failsafe; start-up is also spelled startup, and start up; subthreshold is also spelled sub-threshold, and sub threshold; etc.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for fail-safe start-up circuit for subthreshold current sources have been described.

What is claimed is:

1. An apparatus comprising a lead frame having a first mounting area and a second mounting area, said lead frame first mounting area having two sections, wherein a surface acoustic wave (SAW) device is directly mounted on said lead frame first mounting area, and wherein an integrated circuit (IC) is directly mounted on said lead frame second mounting area, and wherein said two sections are substantially triangular in shape.

2. The apparatus of claim 1 wherein said IC is in electrical communication with said SAW device through said lead frame said first mounting area said two sections.

3. The apparatus of claim 2 further comprising a hermetically sealed oval shaped housing enclosing said SAW device.

4. The apparatus of claim 3 wherein said hermetically sealed oval shaped housing further comprises a fused material around parts of said lead frame, and wherein said SAW device is not directly in mechanical contact with said fused material.

\* \* \* \* \*